(12) United States Patent
Ho et al.

(10) Patent No.: US 9,177,862 B2
(45) Date of Patent: Nov. 3, 2015

(54) SEMICONDUCTOR STACK STRUCTURE AND FABRICATION METHOD THEREOF

(71) Applicant: Xintec Inc., Jhongli (TW)

(72) Inventors: Yen-Shih Ho, Jhongli (TW); Hsin Kuan, Jhongli (TW); Long-Sheng Yeou, Jhongli (TW); Tsang-Yu Liu, Jhongli (TW); Chia-Ming Cheng, Jhongli (TW)

(73) Assignee: XINTEC INC., Taoyuan (TW)

( * ) Notice: Subject to any disclaimer, the term of this patent is extended or adjusted under 35 U.S.C. 154(b) by 281 days.

(21) Appl. No.: 13/727,976

(22) Filed: Dec. 27, 2012

(65) Prior Publication Data

US 2013/0168868 A1 Jul. 4, 2013

Related U.S. Application Data

(60) Provisional application No. 61/580,800, filed on Dec. 28, 2011.

(51) Int. Cl.
*H01L 21/56* (2006.01)
*H01L 23/498* (2006.01)
(Continued)

(52) U.S. Cl.
CPC ............ *H01L 21/82* (2013.01); *B81B 7/007* (2013.01); *H01L 21/6835* (2013.01); *H01L 21/6836* (2013.01); *H01L 21/76898* (2013.01); *H01L 23/14* (2013.01); *H01L 23/147* (2013.01); *H01L 24/24* (2013.01); *H01L 24/82* (2013.01); *H01L 24/92* (2013.01); *H01L 24/97* (2013.01); *B81B 2207/096* (2013.01); *H01L 24/08* (2013.01); *H01L 24/80* (2013.01); *H01L 2221/6834* (2013.01); *H01L 2221/68304* (2013.01); *H01L 2221/68327* (2013.01); *H01L 2221/68363* (2013.01); *H01L 2221/68368* (2013.01); *H01L 2224/08145* (2013.01);
(Continued)

(58) Field of Classification Search
CPC ............... H01L 2924/00014; H01L 2924/00; H01L 2224/94; H01L 2224/32225; H01L 2224/131; H01L 2224/11; H01L 2224/0231; H01L 24/94
USPC ................. 438/460, 113, 107, 109; 257/773
See application file for complete search history.

(56) References Cited

U.S. PATENT DOCUMENTS

| 2002/0192867 A1* | 12/2002 | Nishiyama ............ 438/110 |
| 2003/0092219 A1* | 5/2003 | Ohuchi et al. ........ 438/110 |

(Continued)

FOREIGN PATENT DOCUMENTS

| CN | 101000861 | 7/2007 |
| CN | 101083241 | 12/2007 |
| CN | 102148221 | 8/2011 |
| CN | 102254858 | 11/2011 |
| EP | 1641039 | 3/2006 |
| EP | 2214210 | 8/2010 |
| TW | 200807702 | 2/2008 |

*Primary Examiner* — Vongsavanh Sengdara
*Assistant Examiner* — Thai T Vuong
(74) *Attorney, Agent, or Firm* — Liu & Liu

(57) ABSTRACT

A fabrication method of a semiconductor stack structure mainly includes: singulating a wafer of a first specification into a plurality of chips; rearranging the chips into a second specification of a wafer so as to stack the chips on a substrate of the second specification through a plurality of blocks; forming a redistribution layer on the chips; and performing a cutting process to obtain a plurality of semiconductor stack structures. Therefore, the present invention allows a wafer of a new specification to be processed by using conventional equipment without the need of new factory buildings or equipment. As such, chip packages can be timely supplied to meet the replacement speed of electronic products.

16 Claims, 4 Drawing Sheets

(51) Int. Cl.
  *H01L 21/78* (2006.01)
  *H01L 23/48* (2006.01)
  *H01L 23/28* (2006.01)
  *H01L 21/82* (2006.01)
  *H01L 23/14* (2006.01)
  *H01L 21/683* (2006.01)
  *H01L 21/768* (2006.01)
  *B81B 7/00* (2006.01)
  *H01L 23/00* (2006.01)

(52) U.S. Cl.
  CPC ............ *H01L 2224/08225* (2013.01); *H01L 2224/24011* (2013.01); *H01L 2224/24051* (2013.01); *H01L 2224/24146* (2013.01); *H01L 2224/80006* (2013.01); *H01L 2224/92* (2013.01); *H01L 2224/97* (2013.01); *H01L 2924/1461* (2013.01)

(56) References Cited

U.S. PATENT DOCUMENTS

| | | | |
|---|---|---|---|
| 2004/0266139 A1* | 12/2004 | Shibata | 438/465 |
| 2006/0030078 A1* | 2/2006 | Jiang et al. | 438/113 |
| 2006/0094208 A1* | 5/2006 | Park et al. | 438/460 |
| 2007/0194420 A1* | 8/2007 | Feng | 257/678 |
| 2007/0264753 A1* | 11/2007 | Tomita et al. | 438/113 |
| 2008/0254575 A1* | 10/2008 | Fuergut et al. | 438/127 |
| 2009/0140381 A1 | 6/2009 | Lin et al. | |
| 2009/0166873 A1 | 7/2009 | Yang et al. | |
| 2010/0078822 A1* | 4/2010 | Bauer et al. | 257/773 |
| 2010/0273296 A1* | 10/2010 | Lee et al. | 438/113 |
| 2011/0012214 A1* | 1/2011 | Beer et al. | 257/418 |
| 2011/0024906 A1* | 2/2011 | Meyer et al. | 257/738 |
| 2011/0175221 A1* | 7/2011 | Ni et al. | 257/737 |

* cited by examiner

SEMICONDUCTOR STACK STRUCTURE AND FABRICATION METHOD THEREOF

CROSS-REFERENCE TO RELATED APPLICATIONS

This application claims the benefit of U.S. Provisional Application No. 61/580,800, filed on Dec. 28, 2011, the entire contents of which is incorporated herein by reference.

BACKGROUND OF THE INVENTION

1. Field of the Invention

The present invention relates to semiconductor stack structures and fabrication methods thereof, and more particularly, to a semiconductor stack structure having a plurality of wafers of different specifications and a fabrication method thereof.

2. Description of Related Art

Along with the rapid development of electronic industries, planar packaging technologies have reached their limits and hence integrating technologies are developed to meet the miniaturization requirement of electronic products. For the purpose of multi-function, a plurality of homogeneous or heterogeneous wafers are stacked.

However, a set of process equipment in a wafer packaging factory is specially used for processing a certain specification of wafers. To process a different specification of wafers, a different set of process equipment is required. For example, 8-inch equipment is used for processing 8-inch wafers and 12-inch equipment is used for processing 12-inch wafers. As such, newly developed electronic products need new equipment and even new factory buildings for processing, which adversely affects timely supply of chip packages and cannot meet the replacement speed of electronic products.

Therefore, there is a need to provide a semiconductor stack structure and a fabrication method thereof so as to overcome the above-described drawbacks.

SUMMARY OF THE INVENTION

In view of the above-described drawbacks, the present invention provides a fabrication method of a semiconductor stack structure, which comprises the steps of: providing a wafer having a first surface with a plurality of conductive pads and a second surface opposite to the first surface; disposing the wafer on a first carrier via the first surface thereof; forming a plurality of vias in the wafer via the second surface thereof to expose the conductive pads, respectively; singulating the wafer from the second surface thereof so as to obtain a plurality of chips; moving the chips from the first carrier to a second carrier having a plurality of positioning portions such that the chips are disposed on the second carrier via the second surfaces thereof and the positioning portions are located between the chips, thereby exposing the first surfaces of the chips and forming gaps between the chips; bonding the chips to a substrate via the first surfaces thereof, wherein the substrate has a plurality of blocks disposed on a surface thereof and corresponding in position to the conductive pads, respectively; removing the second carrier and the positioning portions; forming an isolation layer on the second surfaces of the chips, sidewalls of the vias and side surfaces of the chips, wherein the conductive pads are exposed from the vias, respectively; forming a redistribution layer on portions of the isolation layer on the second surfaces of the chips and forming conductive vias in the vias for electrically connecting the redistribution layer and the conductive pads; forming a protection layer on the isolation layer and the redistribution layer on the second surfaces of the chips; and cutting the substrate along the gaps between the chips to obtain a plurality of semiconductor stack structures.

Before forming the vias, the above-described method can further comprise grinding the second surface of the wafer.

The present invention provides another fabrication method of a semiconductor stack structure, which comprises the steps of: providing a wafer having a first surface with a plurality of conductive pads and a second surface opposite to the first surface; disposing the wafer on a first carrier via the first surface thereof; singulating the wafer from the second surface thereof so as to obtain a plurality of chips; moving the chips from the first carrier to a second carrier having a plurality of positioning portions such that the chips are disposed on the second carrier via the second surfaces thereof and the positioning portions are located between the chips, thereby exposing the first surfaces of the chips and forming gaps between the chips; bonding the chips to a substrate via the first surfaces thereof, wherein the substrate has a plurality of blocks disposed on a surface thereof and corresponding in position to the conductive pads, respectively; removing the second carrier and the positioning portions; forming a plurality of vias in the second surfaces of the chips to expose the conductive pads, respectively; forming an isolation layer on the second surfaces of the chips, sidewalls of the vias and side surfaces of the chips, wherein the conductive pads are exposed from the vias, respectively; forming a redistribution layer on portions of the isolation layer on the second surfaces of the chips and forming conductive vias in the vias for electrically connecting the redistribution layer and the conductive pads; forming a protection layer on the isolation layer and the redistribution layer on the second surfaces of the chips; and cutting the substrate along the gaps between the chips to obtain a plurality of semiconductor stack structures.

Before disposing the wafer on the first carrier, the above-described method can further comprise grinding the second surface of the wafer.

The above-described methods can further comprise cutting the substrate along with the blocks.

In the above-described methods, the first carrier can be a glass plate, and the first carrier can be bonded to the first surface of the wafer through an adhesive layer.

The second carrier can be a thermal adhesive tape, a silicon plate or a glass plate.

The positioning portions can be formed by a screen or protrusions formed on the second carrier.

The substrate can be a silicon substrate or a glass plate.

The present invention further provides a semiconductor stack structure, which comprises: a chip having a first surface, a second surface opposite to the first surface and side surfaces adjacent to the first and second surfaces, wherein the first surface is formed with a plurality of conductive pads, the second surface is formed with a redistribution layer, and the side surfaces is formed with an isolation layer, and a plurality of conductive vias are disposed in the chip for electrically connecting the redistribution layer and the conductive pads; a protection layer formed on the second surface and the redistribution layer; and a substrate having a plurality of blocks disposed on a surface thereof and corresponding in position to the conductive pads, respectively, such that the chip is bonded to the substrate via the first surface thereof.

In the above-described structure, the isolation layer can be further disposed between the second surface of the chip and the redistribution layer and on sidewalls of the conductive vias.

In the above-described structure, the substrate can be a silicon substrate or a glass plate.

Therefore, the present invention mainly includes singulating a wafer of a specification into a plurality of chips and rearranging the chips into a conventional specification of a wafer so as to stack the chips on a substrate of the conventional specification, thereby facilitating subsequent processes using conventional equipment. As such, the present invention dispenses with new factory buildings or equipment for a wafer or a new specification so as to timely supply chip packages, thereby meeting the replacement speed of electronic products.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms such as 'top', 'side', 'on', 'a' etc. are only used as a matter of descriptive convenience and not intended to have any other significance or provide limitations for the present invention.

According to the present invention, a plurality of wafers are stacked, packaged and singulated so as to obtain a plurality of semiconductor packages. The semiconductor packages can be applied to various kinds of MEMS (Micro Electro Mechanical Systems), especially image sensors that provide measurements based on electrical or capacitive changes. Particularly, wafer scale packages (WSP) can be applied to image sensors, RF circuits, accelerators, gyroscopes, micro actuators or pressure sensors.

FIGS. 1A to 1G show a fabrication method of a semiconductor stack structure 1 according to a first embodiment of the present invention.

Figure 1A:
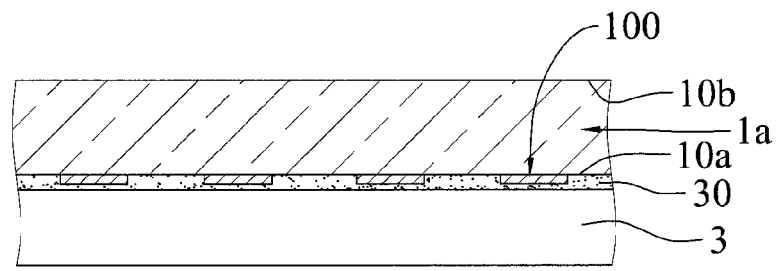
FIGS. 1A to 1G are schematic cross-sectional views showing a fabrication method of a semiconductor stack structure according to a first embodiment of the present invention.

Referring to FIG. 1A, a wafer 1a having a first surface 10a with a plurality of conductive pads 100 and a second surface 10b opposite to the first surface 10a is provided. In the present embodiment, the wafer 1a has a size of 12 inch.

Then, the wafer 1a is disposed on a first carrier 3 via the first surface 10a thereof. In the present embodiment, the first carrier 3 is a glass plate, and the first carrier 3 is bonded to the first surface 10a of the wafer 1a through an adhesive layer 30.

Figure 1B:
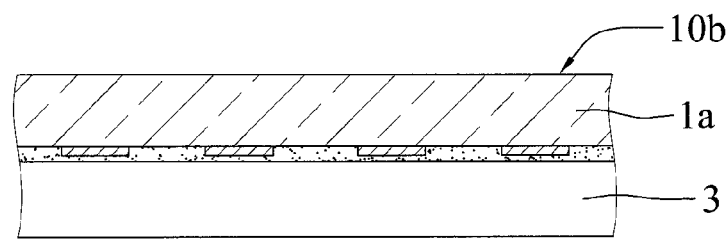

Referring to FIG. 1B, the second surface 10b of the wafer 1a is ground so as to reduce the thickness of the wafer 1a.

Figure 1C:
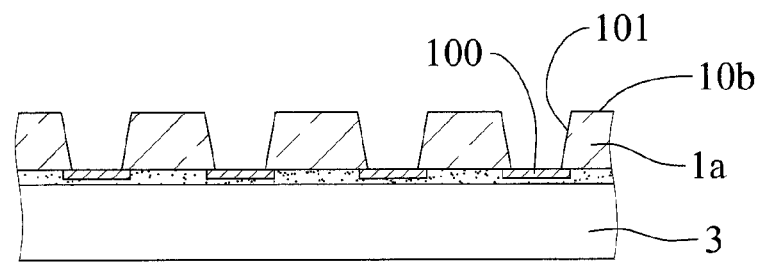
Figure 1D:
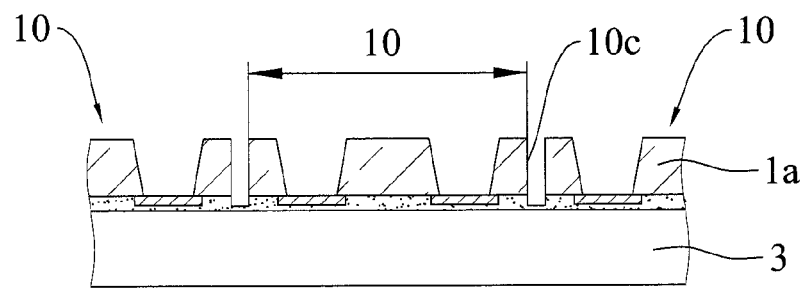

Referring to FIG. 1C, a plurality of vias 101 are formed in the second surface 10b of the wafer 1a so as to expose the conductive pads 100, respectively, Referring to FIG. 1D, the wafer 1a is singulated from the second surface 10b thereof, thereby obtaining a plurality of chips 10. Each of the chips 10 has side surfaces 10c adjacent to the first surface 10a and the second surface 10b thereof.

Figure 1E:
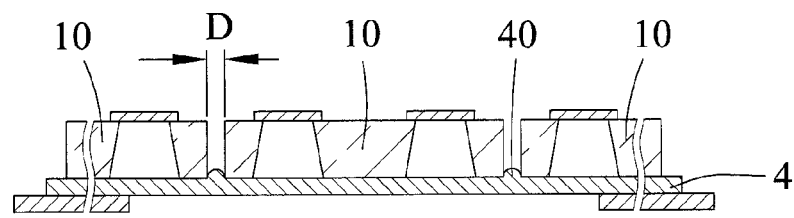

Referring to FIG. 1E, the chips 10 are moved from the first carrier 3 to a second carrier 4 having a plurality of positioning portions 40. The chips 10 are disposed on the second carrier 4 via the second surfaces 10b thereof and the positioning portions 40 are located between the chips 10, thereby exposing the first surfaces 10a of the chips 10 and forming gaps D between adjacent chips 10.

In the present embodiment, the second carrier 4 is a thermal adhesive tape, a silicon plate or a glass plate, and the positioning portions 40 are protrusions formed on the second carrier 4. In particular, the positioning portions 40 are integrally formed with or otherwise fixedly attached to the second carrier 4.

The positioning portions 40 cause the chips 10 singulated from the 12-inch wafer 1a to be rearranged into an 8-inch wafer style. The gaps D between the chips 10 are equal to the gaps of chips singulated from an 8-inch wafer.

Figure 1F:
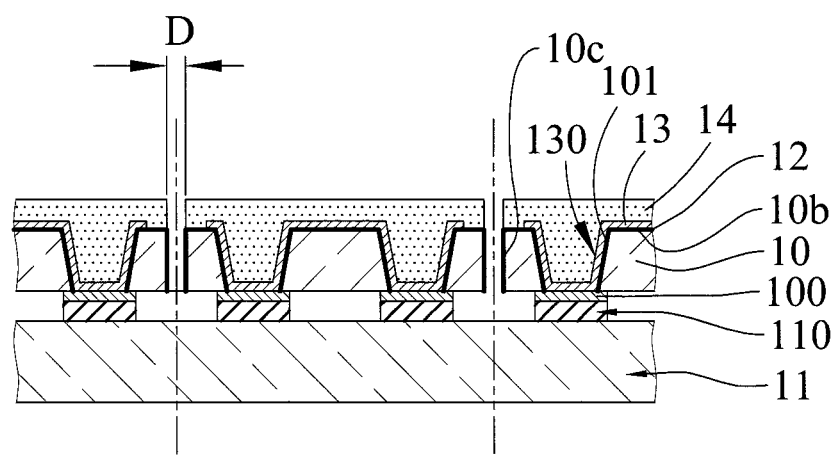

Referring to FIG. 1F, the chips 10 are bonded to a substrate 11 via the first surfaces 10a thereof. The substrate 11 has a plurality of blocks 110 disposed on a surface thereof and corresponding in position to the conductive pads 100, respectively. In the present embodiment, the substrate 11 is a silicon substrate or a glass plate. According to the process or structure requirement, the blocks 100 can be partially bonded with the conductive pads 100, in complete contact with the conductive pads 100, or in no contact with the conductive pads 100.

Then, the second carrier 4 and the positioning portions 40 are removed and an isolation layer 12 is formed on the second surfaces 10b of the chips 10, sidewalls of the vias 101 and the side surfaces 10c of the chips 10. Therein, the conductive pads 100 are exposed from the vias 101, respectively.

Subsequently, a redistribution layer 13 is formed on portions of the isolation layer 12 on the second surfaces 10b of the chips 10, and conductive vias 130 are formed in the vias 101 for electrically connecting the redistribution layer 13 and the conductive pads 100.

Thereafter, a protection layer 14 is formed on the isolation layer 12 and the redistribution layer 13 on the second surfaces 10b of the chips 10.

Figure 1G:
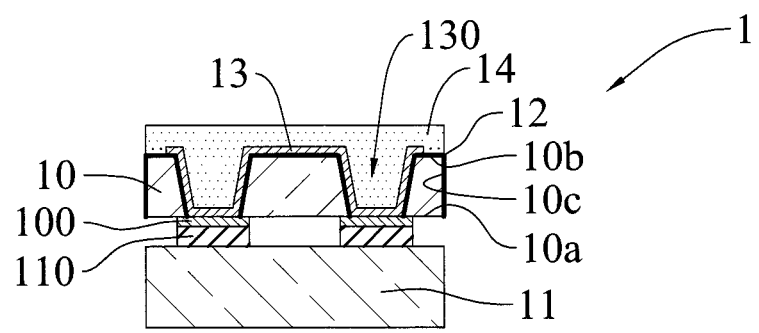

Referring to FIG. 1G, the substrate 11 is cut along the gaps D between the chips 10 so as to obtain a plurality of semiconductor stack structures 1.

In other embodiments, the substrate 11 can be cut along with the blocks 110.

The present method allows a 12-inch wafer 1a to be cut into a plurality of chips 10 and rearranged into an 8-inch wafer style through the second carrier 4 and the positioning portions 40 so as to be stacked on the substrate 11 corresponding to an 8-inch wafer. Therefore, the 12-inch wafer can be processed by 8-inch equipment without the need of new factory buildings or equipment.

FIGS. 2A to 2G show a fabrication method of a semiconductor stack structure 2 according to a second embodiment of the present invention. A main difference of the present embodiment from the first embodiment is the process sequence of vias.

Figure 2A:
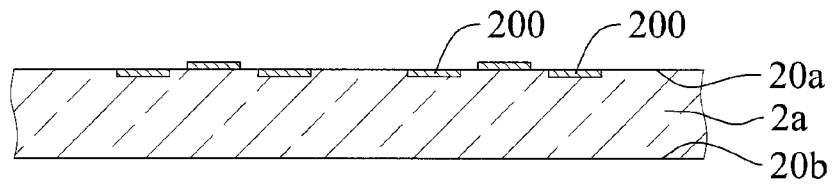
FIGS. 2A to 2G are schematic cross-sectional views showing a fabrication method of a semiconductor stack structure according to a second embodiment of the present invention.

Referring to FIG. 2A, a wafer 2a having a first surface 20a with a plurality of conductive pads 200 and a second surface 20b opposite to the first surface 20a is provided.

The second surface 20b of the wafer 2a is ground and then the wafer 2a is singulated into a plurality of chips 20. Each of the chips 20 has side surfaces 10c adjacent to the first surface 10a and the second surface 10b thereof.

Figure 2B:
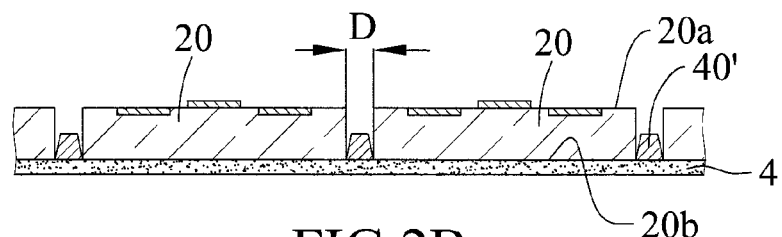

Referring to FIG. 2B, the chips 20 are disposed on a second carrier 4 via the second surfaces 20b thereof so as to expose the first surfaces 20a. The second carrier 4 has a plurality of positioning portions 40' located between the chips 20 to thereby form gaps D between adjacent chips 20.

In the present embodiment, the second carrier 4 is a thermal adhesive tape, and the positioning portions 40' are formed by a screen stacked on the thermal adhesive tape such that the chips 20 are received in openings of the screen, respectively.

Figure 2C:
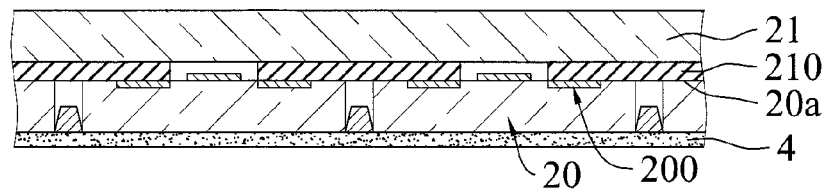

Referring to FIG. 2C, a substrate 21 having a plurality of blocks 210 is provided and the conductive pads 200 are bonded with the blocks 210, respectively, so as for the first surfaces 20a of the chips 20 to be bonded to the substrate 21.

Figure 2D:
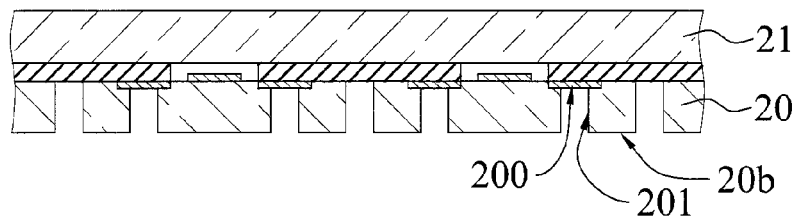

Referring to FIG. 2D, the second carrier 4 and the positioning portions 40 are removed. Then, a plurality of vias 201 are formed in the second surfaces 20b of the chips 20 for exposing the conductive pads 200, respectively.

Figure 2E:
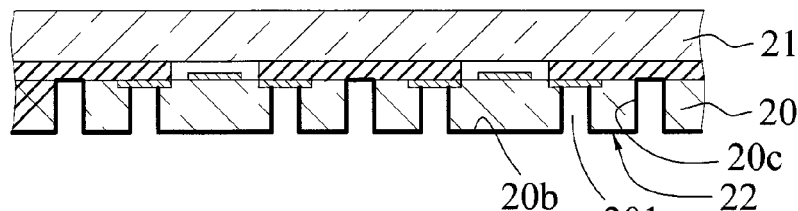

Referring to FIG. 2E, an isolation layer 22 is formed on the second surfaces 20b of the chips 20, sidewalls of the vias 201 and the side surfaces 20c of the chips 20. Therein, the conductive pads 200 are exposed from the vias 201, respectively.

Figure 2F:
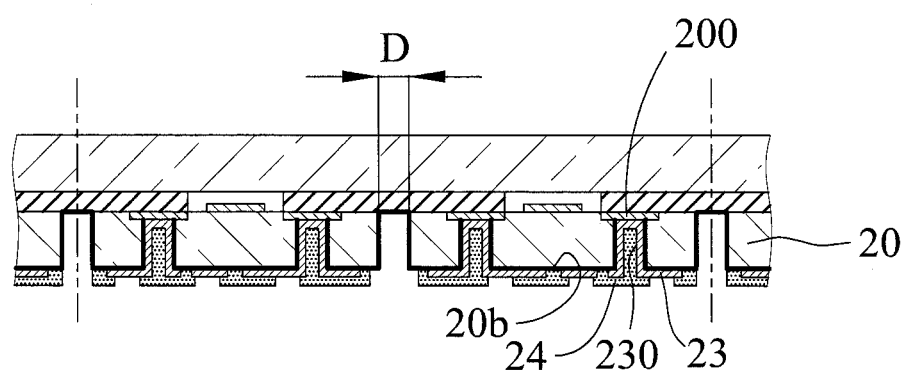

Referring to FIG. 2F, a redistribution layer 23 is formed on portions of the isolation layer 22 on the second surfaces 20b of the chips 20, and conductive vias 230 are formed in the vias 201 for electrically connecting the redistribution layer 23 and the conductive pads 200.

Figure 2G:
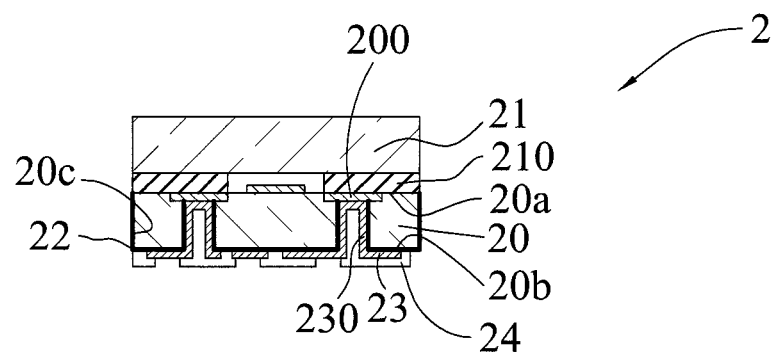

Referring to FIG. 2G, a protection layer 24 is formed on the isolation layer 22 and the redistribution layer 23 on the second surfaces 20b of the chips 20.

Further, the substrate 21 and the blocks 211 are cut along the gaps D between the chips 20 so as to obtain a plurality of semiconductor stack structures 2.

The present invention further provides a semiconductor stack structure 1, 2, which has: a chip 10, 20 having a first surface 10a, 20a, a second surface 10b, 20b opposite to the first surface 10a, 20a and side surfaces 10c, 20c adjacent to the first surface 10a, 20a and the second surface 10b, 20b; a protection layer 14, 24 formed on the second surface 10b, 20b of the chip 10, 20; and a substrate 11, 21 bonded to the first surface 10a, 20a of the chip 10, 20.

The first surface 10a, 20a is formed with a plurality of conductive pads 100, 200, the second surface 10b, 20b is formed with a redistribution layer 13, 23, and the side surfaces 10c, 20c is formed with an isolation layer 12, 22 for preventing damage of the chip 10, 20. Further, a plurality of conductive vias 130, 230 are formed in the chip 10, 20 for electrically connecting the redistribution layer 13, 23 and the conductive pads 100, 200. The isolation layer 12, 22 can be further disposed between the second surface 10b, 20b of the chip 10, 20 and the redistribution layer 12, 23 and on sidewalls of the conductive vias 130, 230.

The protection layer 14, 24 is further formed on the redistribution layer 12, 23.

The substrate 11, 21 can be a silicon substrate or a glass plate, which has a plurality of blocks 110, 210 disposed on a surface thereof for bonding with the conductive pads 100, 200, respectively, thereby bonding the first surface 10a, 20a of the chip 10, 20 to the substrate 11, 21.

Therefore, the present invention allows a wafer of a new specification to be processed by using conventional equipment without the need of new factory buildings or equipment. Consequently, the fabrication cost is reduced, and chip packages can be timely supplied so as to meet the replacement speed of electronic products.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A fabrication method of a semiconductor stack structure, comprising the steps of:
providing a wafer having a first surface with a plurality of conductive pads and a second surface opposite to the first surface;
disposing the wafer on a first carrier via the first surface thereof;
forming a plurality of vias in the wafer via the second surface thereof to expose the conductive pads, respectively;
singulating the wafer from the second surface thereof so as to obtain a plurality of chips;
moving the chips from the first carrier to a second carrier having a plurality of positioning portions such that the chips are disposed on the second carrier via the second surfaces thereof and the positioning portions are located between the chips, thereby exposing the first surfaces of the chips and forming gaps between the chips;
bonding the chips to a substrate via the first surfaces thereof, wherein the substrate has a plurality of blocks disposed on a surface thereof and corresponding in position to the conductive pads, respectively;
removing the second carrier and the positioning portions;
forming an isolation layer on the second surfaces of the chips, sidewalls of the vias and side surfaces of the chips, wherein the conductive pads are exposed from the vias, respectively;
forming a redistribution layer on portions of the isolation layer on the second surfaces of the chips and forming conductive vias in the vias for electrically connecting the redistribution layer and the conductive pads;
forming a protection layer on the isolation layer and the redistribution layer on the second surfaces of the chips; and
cutting the substrate along the gaps between the chips to obtain a plurality of semiconductor stack structures.

2. The method of claim 1, wherein the first carrier is a glass plate.

3. The method of claim 1, wherein the first carrier is bonded to the first surface of the wafer through an adhesive layer.

4. The method of claim 1, wherein the second carrier is a thermal adhesive tape, a silicon plate or a glass plate.

5. The method of claim 1, wherein the positioning portions are formed by a screen or protrusions formed on the second carrier.

6. The method of claim 1, wherein the substrate is a silicon substrate or a glass plate.

7. The method of claim 1, before forming the vias, further comprising grinding the second surface of the wafer.

8. The method of claim 1, further comprising cutting the substrate along with the blocks.

9. A fabrication method of a semiconductor stack structure, comprising the steps of:
providing a wafer having a first surface with a plurality of conductive pads and a second surface opposite to the first surface;
disposing the wafer on a first carrier via the first surface thereof;
singulating the wafer from the second surface thereof so as to obtain a plurality of chips;
moving the chips from the first carrier to a second carrier having a plurality of positioning portions such that the chips are disposed on the second carrier via the second surfaces thereof and the positioning portions are located between the chips, thereby exposing the first surfaces of the chips and forming gaps between the chips;

providing a substrate having a plurality of blocks disposed on a surface thereof and corresponding in position to the conductive pads, respectively, so as for the first surfaces of the chips to be bonded to the substrate;

removing the second carrier and the positioning portions;

forming a plurality of vias in the second surfaces of the chips to expose the conductive pads, respectively;

forming an isolation layer on the second surfaces of the chips, sidewalls of the vias and side surfaces of the chips, wherein the conductive pads are exposed from the vias, respectively;

forming a redistribution layer on portions of the isolation layer on the second surfaces of the chips and forming conductive vias in the vias for electrically connecting the redistribution layer and the conductive pads;

forming a protection layer on the isolation layer and the redistribution layer on the second surfaces of the chips; and cutting the substrate along the gaps between the chips to obtain a plurality of semiconductor stack structures.

10. The method of claim 9, wherein the first carrier is a glass plate.

11. The method of claim 9, wherein the first carrier is bonded to the first surface of the wafer through an adhesive layer.

12. The method of claim 9, wherein the second carrier is a thermal adhesive tape, a silicon plate or a glass plate.

13. The method of claim 9, wherein the positioning portions are formed by a screen or protrusions formed on the second carrier.

14. The method of claim 9, wherein the substrate is a silicon substrate or a glass plate.

15. The method of claim 9, before disposing the wafer on the first carrier, further comprising grinding the second surface of the wafer.

16. The method of claim 9, further comprising cutting the substrate along with the blocks.

* * * * *